United States Patent [19]

Bouley

[11] 4,050,621
[45] Sept. 27, 1977

[54] METHOD AND APPARATUS FOR SOLDERING ELECTRIC TERMINALS TO DOUBLE-SIDED CIRCUIT BOARDS

[75] Inventor: Jean Claude Bouley, Dole, France

[73] Assignee: Bunker Ramo Corporation, Oak Brook, Ill.

[21] Appl. No.: 738,220

[22] Filed: Nov. 3, 1976

[51] Int. Cl.² .................... B23K 1/02; H05K 3/34
[52] U.S. Cl. ............................. 228/180 R; 228/56; 228/247; 428/576
[58] Field of Search ............... 228/56, 180 R, 246, 228/247; 29/193.5

[56] References Cited

U.S. PATENT DOCUMENTS

| 2,604,986 | 7/1952 | Berg | 29/193.5 X |
| 3,750,265 | 8/1973 | Cushman | 228/56 X |
| 3,932,934 | 1/1976 | Lynch et al. | 228/246 X |

FOREIGN PATENT DOCUMENTS 359,813  9/1922  Germany .................... 228/56

Primary Examiner—Al Lawrence Smith
Assistant Examiner—K. J. Ramsey
Attorney, Agent, or Firm—William Lohff; F. M. Arbuckle

[57] ABSTRACT

A method and apparatus for soldering terminals to printed circuit boards, and particularly for soldering terminals simultaneously to both sides of a printed circuit board. The apparatus consists of a connected series of preformed cones of solder which are positioned above holes in the circuit board, and through which terminals to be heated are inserted. The solder flows through the hole by capillary action, and provides electrical connection between the terminal and conduction paths on both sides of the circuit board.

4 Claims, 2 Drawing Figures

METHOD AND APPARATUS FOR SOLDERING ELECTRIC TERMINALS TO DOUBLE-SIDED CIRCUIT BOARDS

BACKGROUND OF THE INVENTION

1. Field of the Invention

This invention pertains to the field of art concerning the preparation of electronic circuit boards, and more particularly to the installation of terminals in double-sided circuit boards.

2. Description of the Prior Art

The continuing trend to miniaturazation of electronic devices, has led to the utilization of printed circuit cards having conduction paths on both surfaces. Electrical connection between conduction paths on opposite sides of the card is effected by either a metallized hole through the card, a terminal soldered on both sides of the card, or by means of a connector in contact with both sides of the card.

Metallizing the walls of holes through the circuit board is a time consuming process. Soldering a terminal first to one surface and then to the other surface of a circuit board is uneconomical and inefficient, since two operations are required. Use of a connector is only possible at the edges of the board, and a great number of contact points may be necessary to accomplish all of the connections.

The prior art also includes the technique consisting of using tubular adapters, through which the solder flows by capillary action. Such a procedure requires enlarged holes through the circuit board, and requires the additional step of installing the tubular adapters.

SUMMARY OF THE INVENTION

It is therefore an object of the present invention to provide a faster and more economical method of achieving electrical connection between a terminal and a conduction path on a printed circuit board. It is a further object of the present invention to provide a one-step process for soldering a terminal to both sides of a circuit board simultaneously. A third object of the present invention is to provide a connection process which can be utilized with any component and which employs standard hole sizes.

According to the present invention, a quantity of solder containing a hole is placed on one surface of the printed circuit board, and a terminal is inserted through the hole in the solder and a corresponding hole in the circuit board. Upon heating of the terminal, the solder melts and flows, by capillary action, through the hole to the other surface of the circuit board, thereby effecting connection between the two surfaces.

The main advantage of the present invention is its simplicity. A quantity of solder, prepared in advance, is melted by the application of heat to the end of the terminal, forming a meniscus of solder on the upper surface of the circuit board, and a metallization of the hole. In this single operation, the desired connections are accomplished rapidly and at a low cost.

According to the present invention, the solder is in the form of a strip comprising a plurality of truncated cones, having holes through their longitudinal axes and of a predetermined size sufficient to fill the hole through the circuit board, make electrical connection to the conduction path on the other side of the board, and still provide an adequate meniscus of solder on the upper surface. The base of each cone is connected to the next cone by a narrow bridging strip of solder. The completed solder strips are prepared so that the holes in the cones align with the holes in the circuit board. This greatly reduces the time necessary to accomplish all of the necessary connections of a board.

DESCRIPTION OF THE PREFERRED EMBODIMENTS

Figure 1:
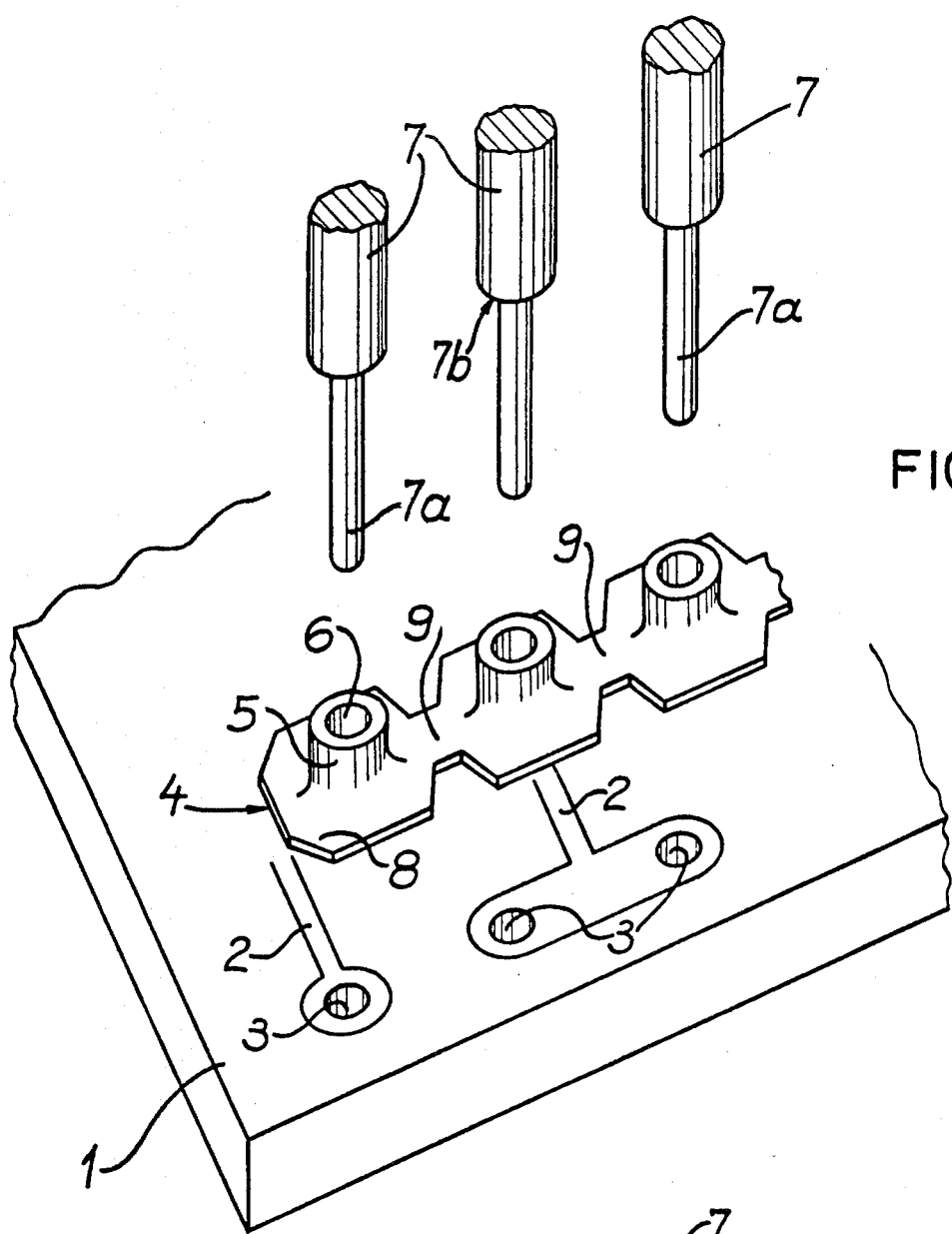
FIG. 1 is a prespective enlarged view of a portion of a circuit board, including a section of the solder strip.

As shown in FIG. 1, a circuit board 1 of insulated material supports metal conduction paths 2 and has connecting holes 3 positioned at a standarized spacing.

A strip 4 of solder material, composed of a plurality of truncated cones 5 containing holes 6 through their longitudinal axes, is placed over a set of holes 3 in the circuit board. The holes 6 in the solder strip 4 are slightly greater in diameter than that of the terminal 7. Each truncated cone 5 includes a flange 8 at its base, and the total volume of solder contained in the cone and flange is sufficient to fill the annular space around the terminal 7 in the hole 3 of circuit board 1, to connect with the conduction path 2' (FIG. 2) on the bottom of the circuit board 1, and form a meniscus on the upper surface of the circuit board.

A bridging strip of solder 9 connects the two flanges 8 of adjoining cones.

The terminals 7 bear extremities 7a having diameters slightly less than that of the holes in the circuit board, and shoulders 7b having diameters slightly greater, thereby limiting the depth of penetration of the terminals 7 into the circuit board.

Figure 2:
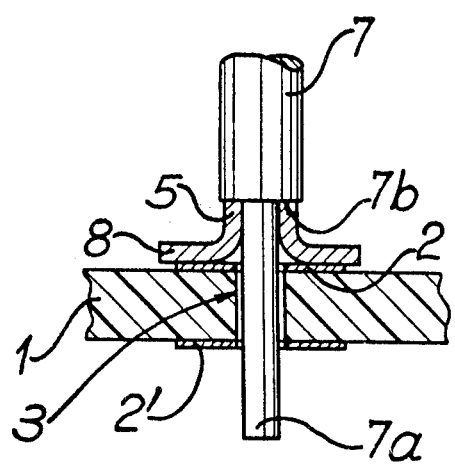
FIG. 2 is a cross-sectional view of a terminal in place through the soldering strip and circuit board before melting of the solder.

FIG. 2 shows a terminal 7 in place in the circuit board 1 before the solder is melted. The extremity 7a of the terminal 7 extends through the truncated cone 5 and into the circuit board 1 through hole 3. Upon applying heat to the extremity 7a, the solder will melt and flow into hole 3, providing electrical connection between conduction path 2 on the upper surface and conduction path 2' on the lower surface of the circuit board.

In order to solder a terminal 7 to a double-sided circuit board 1, using the method of the present invention, the following procedure is used:

a. The solder strip 4, such as described above, is placed on the upper surface of the circuit board 1, in such a way that the holes 6 in the truncated cones 5 align with the holes 3 in the circuit board 1;

b. The terminals 7 are inserted through the holes 6 of the solder strip 4, the conduction path 2 about holes 3, the holes 3 of the circuit board 1, and the conduction path 2;

c. A downward force is maintained on the terminal 7, so that when the solder melts the terminals will move downward so that the shoulders 7b will come in contact with the conduction path 2;

d. A source of heat is applied to the extremity 7a of the terminal 7 which extends below the circuit board 1, causing the solder to melt and flow through the annular space between the terminal 7 and the wall of the hole 3 through the circuit board, and form menisci of solder on the conduction path 2 on the upper surface of the circuit board 1 and on the conduction path 2 on the lower surface of the circuit board.

When the solder melts, the bridging strips 9 will seperate due to the effect of the surface tension of the solder on the insulating material of the circuit board 1. Therefore, all of the solder formerly contained in the shape of the bridging strip will flow into or about the holes 3 in the circuit board where it becomes part of the menisci on the conduction paths.

It should be understood that the word terminal as used above is a generic term and includes plug contacts, wire conductors, and all forms of component terminals.

It is to be understood that the invention is not limited to the specific embodiments described herein, but is to be limited only by the appended claims.

What we claim is:

1. A method for soldering elongate conductors perpendicular to a circuit board, comprising the steps of:
   providing an elongate strip of fusable solder material comprising a plurality of interconnected sections each comprising a substantially flat base portion and a central portion protruding from one face of the base portion, each of said central portions defining a central opening through the base portion to receive an elongate conductor to be soldered to said board, and said base portions of adjacent sections being joined by neck portions of the solder material, said neck portions being narrower than said base portions;
   placing said strip on a circuit board with said elongate conductors passing through said openings in the strip at selected locations relative to the board; and
   fusing said strip to sever said neck portions by surface tension of the fused solder material and to form each said section into a discrete meniscus about the conductor passing through said opening.

2. The method as claimed in claim 1, further comprising the step of passing said elongate conductors through openings in said board corresponding to openings in said strip with said ends protruding from an underneath face of said board, and wherein said fusing step comprises heating said protruding ends of the conductors.

3. The method as claimed in claim 2, wherein said protruding ends of the conductors are heated in a molten bath of solder material to simultaneously solder said protruding ends of the conductors to said underneath face of said board.

4. An elongate strip of fusable solder material comprising a plurality of interconnected sections each comprising a substantially flat base portion and a central portion protruding from one face of the base portion, and wherein:
   each of said central portions defines a central opening through the base portion to receive an elongate conductor to be soldered to a board supporting the solder strip;
   said base portions of adjacent sections are joined by neck portions of the solder material, said neck portions being relatively narrower than said base portions;
   said solder material has a surface tension in the fused state; and
   each said section contains such a quantity of said material that, upon being fused, said neck portions sever and said sections form discrete meniscuses about said elongate conductors at the point where said conductors enter said openings.

* * * * *